United States Patent
Lee et al.

(10) Patent No.: US 9,190,766 B2
(45) Date of Patent: Nov. 17, 2015

(54) ELECTRONIC CONTROL APPARATUS FOR VEHICLE USING WATER PROOF TYPE HOUSING SEALING AND METHOD THEREOF

(71) Applicant: Hyundai Autron Co., Ltd., Seongnam-si (KR)

(72) Inventors: Wan Kyu Lee, Yongin-si (KR); Man Ho Seok, Seongnam-si (KR)

(73) Assignee: HYUNDAI AUTRON CO., LTD., Seongnam-Si (KR)

( * ) Notice: Subject to any disclaimer, the term of this patent is extended or adjusted under 35 U.S.C. 154(b) by 73 days.

(21) Appl. No.: 14/139,863

(22) Filed: Dec. 23, 2013

(65) Prior Publication Data
US 2014/0362499 A1 Dec. 11, 2014

(30) Foreign Application Priority Data
Jun. 11, 2013 (KR) .......................... 10-2013-0066372

(51) Int. Cl.
| | |
|---|---|
| H05K 5/06 | (2006.01) |
| H01R 13/52 | (2006.01) |
| H05K 5/00 | (2006.01) |
| H05K 3/28 | (2006.01) |
| H05K 3/32 | (2006.01) |

(52) U.S. Cl.
CPC ............ *H01R 13/5216* (2013.01); *H05K 3/284* (2013.01); *H05K 3/32* (2013.01); *H05K 5/0039* (2013.01); *H05K 5/064* (2013.01); *Y10T 29/49171* (2015.01)

(58) Field of Classification Search
CPC ......................... Y10S 439/936; H01R 13/5216
See application file for complete search history.

(56) References Cited

U.S. PATENT DOCUMENTS

| | | | | |
|---|---|---|---|---|
| 5,032,085 | A | * | 7/1991 | Alwine et al. ................ 439/79 |
| 5,264,661 | A | * | 11/1993 | Luettgen ....................... 174/539 |
| 6,835,090 | B1 | * | 12/2004 | Liedtke ......................... 439/521 |
| 2004/0029432 | A1 | * | 2/2004 | Denneler et al. ............. 439/426 |
| 2007/0072452 | A1 | * | 3/2007 | Inagaki et al. ............... 439/76.2 |
| 2007/0117440 | A1 | * | 5/2007 | Nagashima et al. .......... 439/271 |
| 2011/0053398 | A1 | * | 3/2011 | Arai et al. ..................... 439/271 |
| 2011/0108320 | A1 | * | 5/2011 | Lakner et al. ................. 174/650 |
| 2012/0236479 | A1 | * | 9/2012 | Tamai et al. ............. 361/679.01 |
| 2013/0229097 | A1 | * | 9/2013 | Tamai et al. ............... 312/223.6 |
| 2014/0362534 | A1 | * | 12/2014 | Seok et al. .................... 361/707 |

FOREIGN PATENT DOCUMENTS

| | | |
|---|---|---|
| JP | 07-039181 A | 2/1995 |
| JP | 2008-244379 A | 10/2008 |

* cited by examiner

*Primary Examiner* — James Harvey
(74) *Attorney, Agent, or Firm* — Mayer Brown LLP; Hyunho Park

(57) ABSTRACT

The present disclosure relates to an electronic control apparatus for a vehicle using waterproof housing sealing and a manufacturing method thereof, and the electronic control apparatus includes: an electronic control element configured to electrically control each part of the vehicle; a connector electrically connected with the electronic control element; a housing having an opened one side surface, the connector connected with the electronic control element being inserted from the one side surface in the slot type to be accommodated in the housing; and a connector cover coupled with the connector to cover the opened one side surface of the housing, in which a flange extended by a predetermined length toward the outside is formed on the opened one side surface of the housing along a side surface of the housing, and a potting layer is formed inside the flange on the connector cover.

10 Claims, 7 Drawing Sheets

ELECTRONIC CONTROL APPARATUS FOR VEHICLE USING WATER PROOF TYPE HOUSING SEALING AND METHOD THEREOF

CROSS-REFERENCE TO RELATED APPLICATIONS

This application is based on and claims priority from Korean Patent Application No. 10-2013-0066372, filed on Jun. 11, 2013, with the Korean Intellectual Property Office, the disclosure of which is incorporated herein in its entirety by reference.

TECHNICAL FIELD

The present disclosure relates to an electronic control apparatus for a vehicle, and more particularly, to an electronic control apparatus having a tight sealing structure between a housing body and a connector cover in an electronic control apparatus, such as an electronic control unit (ECU) of an engine, of a vehicle.

BACKGROUND

In general, an electronic control apparatus such as an ECU, which electronically controls various types of devices, is equipped in a vehicle. The electronic control apparatus receives information from sensors or switches installed at each part of the vehicle. The electronic control apparatus serves to perform various electronic controls for promoting improvement of a riding quality and safety of the vehicle or providing various items of convenience to a driver and a passenger by processing the received information.

For example, the electronic control apparatus such as the ECU, which controls states of an engine, an automatic transmission, an anti-lock brake system (ABS), and the like in the vehicle using a computer, also serves to control all parts in the vehicle, such as a driving system, a braking system, and a steering system as well as the control of the automatic transmission as the vehicle and the computer have been developed in terms of performance.

The electronic control apparatus such as the ECU has a structure that includes a case which includes an upper cover and a lower base, a printed circuit board (PCB) which is accommodated in the case, a connector which is coupled to a front end of the PCB so as to be connected to an external socket, and the like.

The case has a structure in which the cover and the base are assembled together with the PCB while covering the PCB, and particularly, the connector, which is interposed between the cover and the base when the cover and the base are assembled, forms a sealing structure with the cover side and the base side.

The electronic control apparatus includes a high integrated control circuit means and thus requires a predetermined sealing structure that may prevent external moisture or foreign substances from flowing into the electronic control apparatus, and the electronic control apparatus mainly adopts a sealing structure in which the cover and the base are typically assembled together with the connector in a state in which sealing materials are inserted on connected portions between the cover and the base and the connector so as to protect the PCB and the like in the electronic control apparatus.

However, the sealing structures applied to the electronic control apparatus in the related art mostly have a structure in which a sealing member is applied on a connected portion between a groove or protrusion at the connector side and a protrusion or a groove at the cover side and the base side, so that it fails to secure a sufficient sealing area and as a result, there is a difficulty in securing a sealing quality of an assembled portion between the connector, and the cover and the base.

A slot type electronic control apparatus has a sealing structure in which an O-ring is inserted between a housing body and a cover.

FIG. 1 is a diagram illustrating an example of coupling of an electronic control apparatus including slot type housing in the related art, and FIG. 2 is a perspective view of an O-ring used in the electronic control apparatus of FIG. 1.

As illustrated in FIG. 1, the electronic control apparatus including the slot type housing in the related art includes a housing body 110, a cover 120, a connector 130, and a PCB 140.

The housing body 110 is a slot type body among existing various types of housings.

The connector 130 includes an inner pin and an outer pin, and is coupled to the cover 120.

The cover 120 is coupled with the PCB 140, and a slot formed by the PCB 140 is coupled with the housing body 110. Here, an O-ring 121 is inserted between the housing body 110 and the cover 120.

That is, in a case of the waterproof slot type housing in the related art, the O-ring 121 is inserted between the housing body 110 and the cover 120. The housing body 110 is in close contact with the cover 120 so that a coupled region between the housing body 110 and the cover 120 is sealed. Accordingly, the O-ring 121 suitable for the cover 120 needs to be manufactured in advance before the housing body 110 is coupled with the cover 120, and the manufactured O-ring 120 needs to be mounted inside the cover 120.

FIG. 3 and FIG. 4 are a cross-sectional view of a coupling state of the electronic control apparatus including a slot type housing in the related art, and FIG. 3 is a cross-sectional view of a coupling state of the electronic control apparatus adopting a slot type waterproof sealing structure, and FIG. 4 is a cross-sectional view of a coupling state of a slot type non-waterproof electronic control apparatus.

In a case of FIG. 3, the connector 131 is a special connector integrated with a cover, and the cover 131 is coupled with the PCB 140 and the slot formed by the PCB 140 is coupled with the housing body 110. The O-ring 121 is inserted between the housing body 110 and the connector 131, so that the coupling portions are in close contact with each other so as to be sealed.

However, in a case of FIG. 4, the cover 130 is coupled with the PCB 140, the slot formed by the PCB 140 is coupled with the housing body 110, and a means, such as the O-ring, for sealing the coupling portion is connected between the housing body 110 and the connector 130, so that there is a problem in that it is impossible to prevent external moisture or foreign substances from flowing into the housing.

SUMMARY

The present disclosure has been made in an effort to provide an electronic control apparatus including a slot type housing, which includes a separate potting layer capable of preventing external moisture or foreign substances from flowing into the housing.

The present disclosure has been made in an effort to provide an electronic control apparatus, in which a sealing space between a connector cover and a housing body is sealed without using a special connector or an O-ring in the related art, so that it is possible to improve waterproof performance between the connector cover and the housing body, and simplify a manufacturing process.

An exemplary embodiment of the present disclosure provides an electronic control apparatus for a vehicle, including: an electronic control element configured to electrically control each part of the vehicle; a connector electrically connected with the electronic control element; a housing having an opened one side surface, the connector connected with the electronic control element being from the one side surface in the slot type to be accommodated in the housing; and a connector cover coupled with the connector to cover the opened one side surface of the housing, in which a flange extended by a predetermined length toward the outside is formed on the opened one side surface of the housing along a side surface of the housing, and a potting layer is formed inside the flange on the connector cover.

The potting layer may be sealed with the housing and the connector cover to prevent foreign substances from flowing into the housing.

A length of the flange of the housing may be larger than a height of the potting layer.

The potting layer may be formed of silicon, epoxy, or urethane.

A height of the potting layer may be equal to or larger than 3 mm and equal to or smaller than 10 mm.

Another exemplary embodiment of the present disclosure provides a method of manufacturing an electronic control apparatus for a vehicle, including: configuring an electronic control element, which electrically controls each part of the vehicle, by mounting various electronic devices in a printed circuit board; coupling the electronic control element with a connector; coupling the connector with a connector cover; inserting the connector coupled with the electronic control element in a housing having opened one side surface in a slot type, and accommodating the connector and the electronic control element inside the housing so that the opened one side surface is covered with the connector cover; and sealing the housing and the connector cover by forming a potting layer having a predetermined height on a top side of the cover.

The potting layer may be sealed with the housing and the connector cover to prevent foreign substances from flowing into the housing.

A flange extended by a predetermined length toward the outside may be formed on the opened one side surface of the housing along a side surface of the housing, and a potting layer may be formed inside the flange on the connector cover.

A length of the flange of the housing may be larger than a height of the potting layer.

The potting layer may be formed of silicon, epoxy, or urethane.

A height of the potting layer may be equal to or larger than 3 mm and equal to or smaller than 10 mm.

According to the exemplary embodiments of the present disclosure, there is provided the electronic control apparatus including a separate potting layer capable of preventing external moisture or foreign substances from flowing into the housing.

According to the exemplary embodiments of the present disclosure, the sealing space between the connector cover and the housing body is sealed without using a special connector or the O-ring in the related art, so that it is possible to improve waterproof performance between the connector cover and the housing body, and simplify a manufacturing process.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
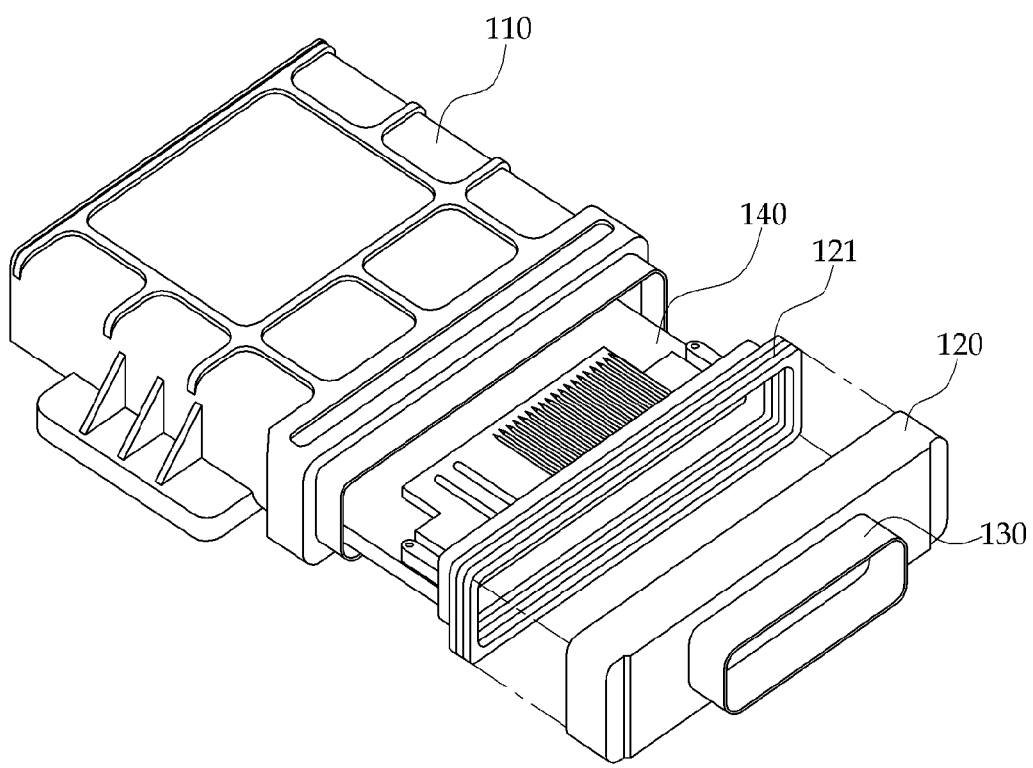
FIG. 1 is a diagram illustrating an example of coupling of an electronic control apparatus including a slot type housing in the related art.
Figure 2:
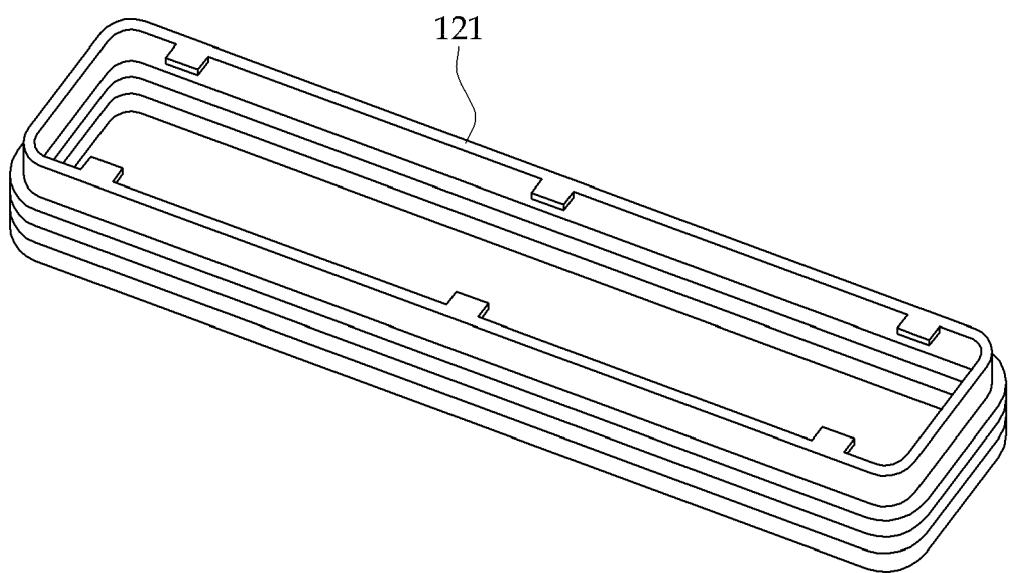
FIG. 2 is a perspective view of an O-ring used in the electronic control apparatus in the related art.
Figure 3:
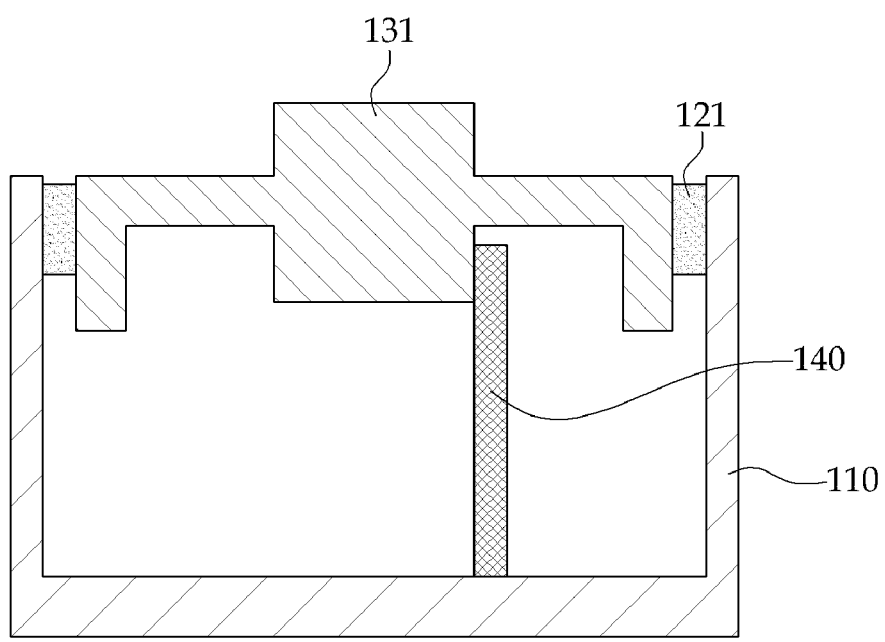
FIG. 3 is a cross-sectional view of a coupling state of an electronic control apparatus adopting a slot type waterproof sealing structure.
Figure 4:
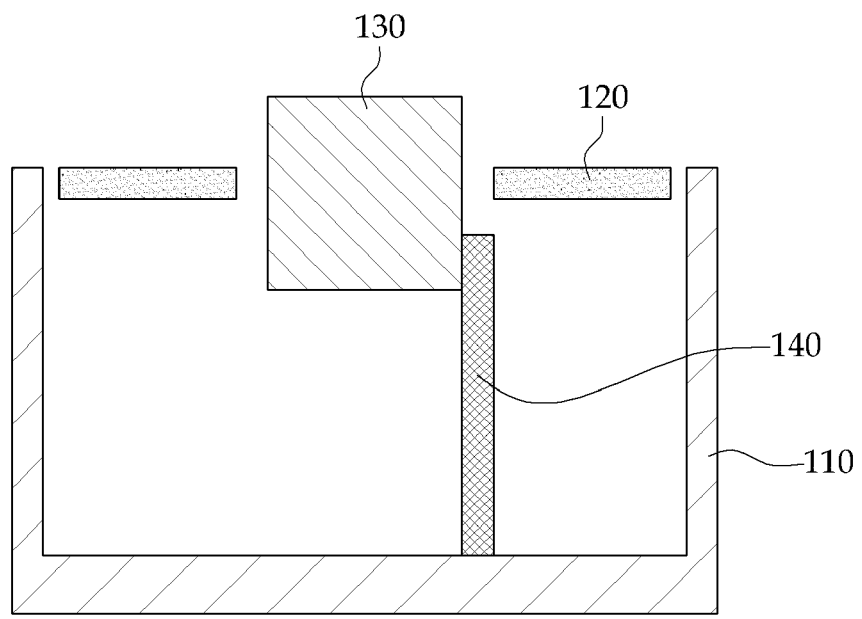
FIG. 4 is a cross-sectional view of a coupling state of a slot type non-waterproof electronic control apparatus.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, exemplary embodiments according to the present disclosure will be described in detail with reference to accompanying drawings. A configuration and an operational effect thereof of the present disclosure will be clearly understood through the detailed description below. In the following description, the same elements will be designated by the same reference numerals although they are shown in different drawings, and a detailed explanation of known related functions and constitutions may be omitted when it is determined that the detailed explanation obscures the subject matter of the present disclosure.

Figure 5:
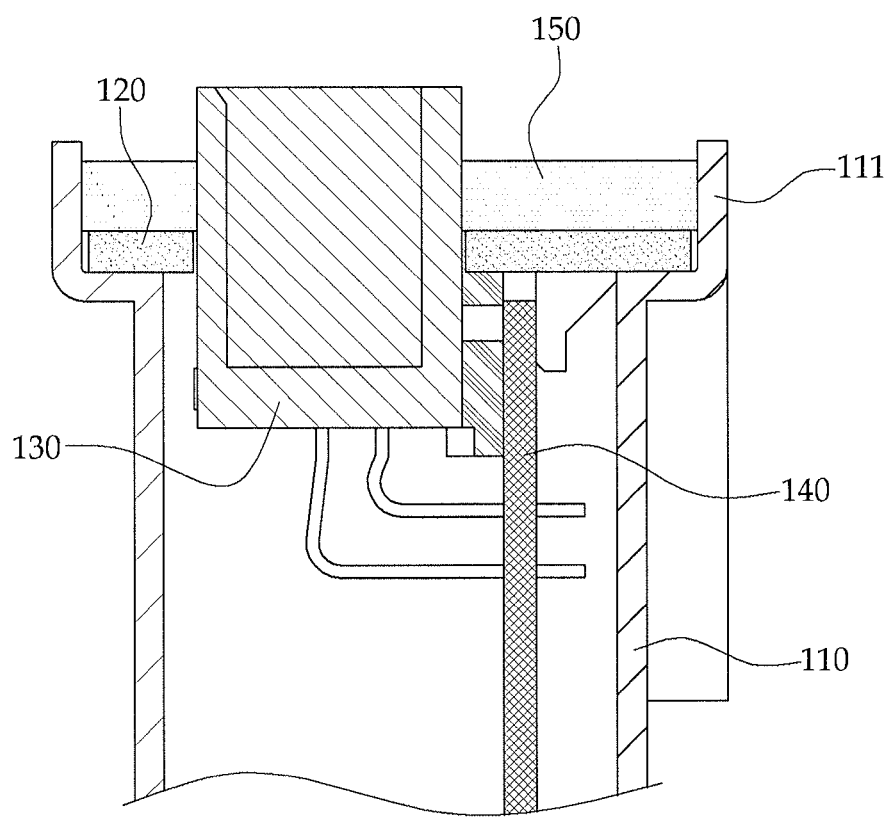
FIG. 5 is a cross-sectional view of a coupling state of an electronic control apparatus adopting a slot type waterproof sealing structure according to an exemplary embodiment of the present disclosure.

FIG. 5 is a cross-sectional view of a coupling state of an electronic control apparatus adopting a slot type waterproof sealing structure according to an exemplary embodiment of the present disclosure.

The electronic control apparatus is a component including an electronic control element, for example, an integrated control circuit means, such as a PCB 140, electrically controlling each part of the vehicle, and requires a tight sealing structure for preventing external moisture or foreign substances from flowing in. To this end, the electronic control apparatus has a form of a waterproof slot type housing.

As illustrated in FIG. 5, the electronic control apparatus includes a housing body 110, a connector 130, a connector cover 120, and a PCB 140.

The connector 130 is coupled with and electrically connected to the PCB 140. The connector 130 includes a connector pin, and is electrically connected with the PCB 140 through the connector pin. The connector pin may include a plurality of inner pins for connection with the inside PCB 140, and a plurality of outer pins for connection with the outside. The connector 130 may be physically fitted to and coupled with the PCB 140, and may be electrically connected with the PCB 140 through the inner pin. The connector 130 may be formed in an integrated form of a front end portion exposed to the outside and a rear end portion.

The PCB 140 may include an electric element, a heating element, or a heat radiating plate at a top side or a bottom side. The connector cover 120 is connected with the connector 130 outside thereof, and is connected with the PCB 140 inside the housing.

One side surface of the housing 110 is opened, and the connector 130 connected with the PCB 140 is inserted from the one side surface in a slot type to be accommodated in the housing 110. Accordingly, when the connector 130 and the PCB 140 are inserted into and accommodated inside the housing 110 in the slot type, the connector cover 120 covers the opened one side surface of the housing 110, so that the connector part including the PCB 140 and the connector cover 120 may be accommodated in the housing 110.

In this case, as illustrated in the drawing, a flange 111 extended by a predetermined length toward the outside is formed along a side surface of the housing 110 on the opened one side surface of the housing 110. When a potting layer or a potting film is formed inside the housing, a shape of the flange 111 of the housing is formed during the hardening of a potting material and the flange 111 serves to prevent the potting material from running down to the outside.

A predetermined potting layer 150 is formed on a top side of the housing 110, that is, the top side of the connector cover 120 inside which the connector 130 connected with the PCB 140 is inserted into and accommodated inside the housing 110 in the slot type. The potting layer 150 is formed in a height of about 3 mm to 10 mm inside the flange 111 of the housing. The potting layer 150 may be formed to have a height of about 3 to 4 mm.

The potting layer 150 may be formed of silicon, epoxy, or urethane, and may use a material which has predetermined viscosity and is naturally hardened even though heat is not applied. However, depending on a case, the potting layer may be hardened by applying heat with an oven.

As illustrated in FIG. 5, the flange 111 is formed in the housing 110, and the potting layer 150 is formed inside the flange 111, so that it is not necessary to mount the O-ring in the connector cover in advance or use a special connector in which the connector is integrally formed with the cover like the related art.

In a case where the sealing structure according to the exemplary embodiment of the present disclosure is applied, a sufficient sealing space and area may be secured, thereby achieving advantages of improving assembling performance and sufficiently securing sealing performance during the manufacturing process of the electronic control apparatus.

Hereinafter, a method of manufacturing the electronic control apparatus will be described.

First, an electronic control element electrically controlling each part of a vehicle is configured by mounting various electronic elements in a PCB 140.

Then, a connector 130 is coupled and electrically connected with the PCB 140. The connector 130 includes a connector pin, and is electrically connected with the PCB 140 through the connector pin. The connector pin may include a plurality of inner pins for connection with the internal PCB 140, and a plurality of outer pins for connection with the outside.

Then, a connector cover 120 is coupled with the connector 130, the connector 130 coupled with the PCB 140 is inserted into a housing 110 having an opened one side surface in a slot type, and the connector cover covers the opened one side surface so that the connector 130 and the PCB 140 are accommodated inside the housing.

Figure 6:
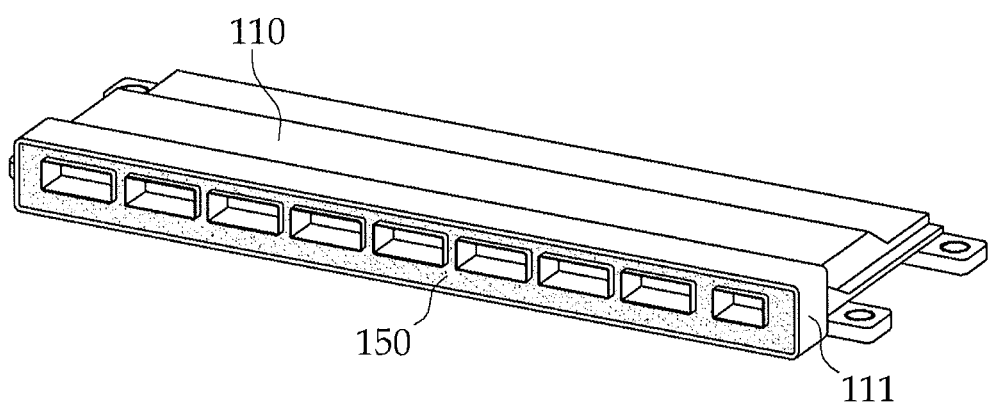
FIGS. 6 and 7 are reference views schematically illustrating forming of a cover and a potting layer of the electronic control apparatus according to the exemplary embodiment of the present disclosure.
Figure 7:
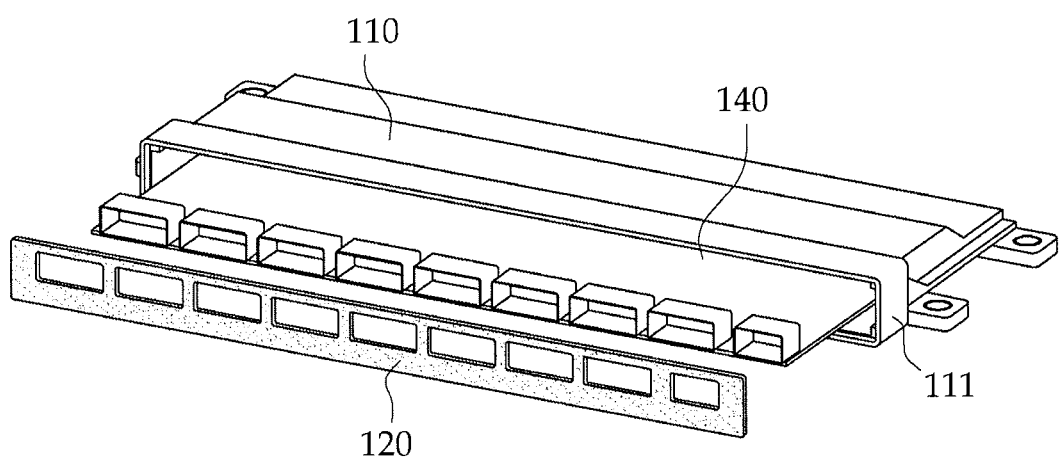

FIGS. 6 and 7 are reference views schematically illustrating forming of the cover and the potting layer of the electronic control apparatus according to the exemplary embodiment of the present disclosure.

Referring to FIG. 5 and FIG. 6, the connector 130 coupled with the PCB 140 is inserted into the housing 110 in the slot type, and the opened one side surface of the housing 110 is covered with the connector cover 120. In this case, the connector 130 may be inserted into the housing after the connector cover 120 is coupled with the connector 130.

Then, as illustrated in FIG. 7, the potting layer 150 is formed on an outside surface of the connector cover 120, so that the sealing of the housing is completed. In this case, as previously described, the flange 111 is formed toward the outside on the one side surface of the housing 110, and the potting layer 150 is formed inside the flange 111.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An electronic control apparatus for a vehicle, comprising:
   an electronic control element configured to electrically control many parts of the vehicle;
   a connector electrically connected with the electronic control element;
   a housing having an opening on one side, the connector connected with the electronic control element being inserted into the housing in the opening to be accommodated; and
   a connector cover coupled with the connector to cover the opening of the housing,
   wherein a flange extended by a predetermined length toward the outside is formed along a side surface of the housing to receive the connector cover, and a potting layer is formed inside the flange on the connector cover, and
   wherein the perimeter of the inner surface of the flange is equal or greater than the perimeter of the outer surface of the housing, and the perimeter of the outer surface of the connector cover is greater than the perimeter of the inner surface of the housing so that the connector cover fits on the housing and inside the flange.

2. The electronic control apparatus of claim 1, wherein the potting layer is sealed with the housing and the connector cover to prevent foreign substances from flowing into the housing.

3. The electronic control apparatus of claim 1, wherein a length of the flange of the housing is larger than a height of the potting layer.

4. The electronic control apparatus of claim 1, wherein the potting layer is formed of silicon, epoxy, or urethane.

5. The electronic control apparatus of claim 1, wherein a height of the potting layer is equal to or larger than 3 mm and equal to or smaller than 10 mm.

6. A method of manufacturing an electronic control apparatus for a vehicle, comprising:

configuring an electronic control element, which electrically controls many parts of the vehicle, by mounting various electronic devices in a printed circuit board;

coupling the electronic control element with a connector;

coupling the connector with a connector cover;

inserting the connector coupled with the electronic control element in a housing having an opening on one side, and accommodating the connector and the electronic control element inside the housing so that the opening of the housing is covered with the connector cover;

forming a flange extended by a predetermined length toward the outside along a side surface of the housing, and fitting the connector cover inside of the flange; and sealing the housing and the connector cover by forming a potting layer having a predetermined height on a top side of the connector cover and inside the flange, wherein the perimeter of the inner surface of the flange is equal or greater than the perimeter of the outer surface of the housing, and the perimeter of the outer surface of the connector cover is greater than the perimeter of the inner surface of the housing so that the connector cover fits on the housing and inside the flange.

7. The method of claim 6, wherein a height of the potting layer is equal to or larger than 3 mm and equal to or smaller than 10 mm.

8. The method of claim 6, further comprising:
hardening the potting layer.

9. The method of claim 6, wherein a length of the flange of the housing is larger than a height of the potting layer.

10. The method of claim 6, wherein the potting layer is formed of silicon, epoxy, or urethane.

* * * * *